United States Patent
Cairo

(10) Patent No.: US 7,236,802 B2
(45) Date of Patent: Jun. 26, 2007

(54) COUPLING DEVICE FOR INTERFACING POWER AMPLIFIER AND ANTENNA IN DIFFERENTIAL MODE

(75) Inventor: Ignasi Cairo, Barcelona (ES)

(73) Assignee: Seiko Epson Corporation (JP)

( * ) Notice: Subject to any disclaimer, the term of this patent is extended or adjusted under 35 U.S.C. 154(b) by 163 days.

(21) Appl. No.: 10/938,388

(22) Filed: Sep. 10, 2004

(65) Prior Publication Data

US 2005/0075083 A1    Apr. 7, 2005

(30) Foreign Application Priority Data

Sep. 11, 2003    (EP)    ................... 03020433

(51) Int. Cl.
*H04M 1/00*    (2006.01)
(52) U.S. Cl. .................. 455/556.1; 455/120; 455/107; 455/77; 455/115.1
(58) Field of Classification Search ............. 455/556.1, 455/120, 107, 77, 115.1
See application file for complete search history.

(56) References Cited

U.S. PATENT DOCUMENTS

| | | | |
|---|---|---|---|
| 2003/0022638 A1* | 1/2003 | Imai et al. ................... | 455/107 |
| 2003/0043078 A1 | 3/2003 | Deng et al. | |
| 2003/0092408 A1 | 5/2003 | Frank | |

FOREIGN PATENT DOCUMENTS

| | | |
|---|---|---|
| EP | 1 283 601 | 2/2003 |
| WO | WO 95/01676 | 1/1995 |
| WO | WO 97/25820 | 7/1997 |

OTHER PUBLICATIONS

Communication from European Patent Office re: counterpart application.
Bert Schmitz, "Considerations in RF Power Amplifer Technologies for Mobile Phone & Wireless Applications", ECN Suplemental, May 2001, pp. 9-10, 14.
D. Barataud et al., "Optimum Design of Very High-Efficiency Microwave Power Amplifiers Based on Time-Domain Harmonic Load-Pull Measurements", IEEE Transactions on Microwave Theory and Techniques, vol. 49, No. 6, Jun. 2001, pp. 1107-1112.
Y. Chung et al., "AlGaN/GaN HFET Power Amplifer Integrated With Microstrip Antenna for RF Front-End Applications", IEEE Transactions on Microwave Theory and Techniques, vol. 51, No. 2, Feb. 2003, pp. 653-659.
M. Cryan et al., "Integrated Active Antenna with Full Duplex Operation", IEEE Transactions on Microwave Theory and Techniques, vol. 45, No. 10, Oct. 1997, pp. 1742-1748.
J.D. Fredrick et al., "Recent Developments in RF Front Ends Based Upon Active Antenna Concepts", IEEE, Sep. 2001, pp. 3-9.

* cited by examiner

*Primary Examiner*—Joseph Feild
*Assistant Examiner*—S. Smith
(74) *Attorney, Agent, or Firm*—Harness, Dickey & Pierce, P.L.C.

(57) ABSTRACT

A coupling device for coupling an electronic circuit for at least one antenna unit to exchange electrical signals between the electronic circuit and the at least one antenna unit comprises a first input/output signal path, a matching unit coupled to the first input/output signal path, a filter unit coupled to the output of the matching unit by means of a second signal path and a second input/output signal path for connecting the filter unit to the at least one antenna unit, wherein the signal path arranged between the electronic circuit and the at least one antenna unit are provided completely differential.

16 Claims, 4 Drawing Sheets a)

b)

a)

b)

a)

b)

COUPLING DEVICE FOR INTERFACING POWER AMPLIFIER AND ANTENNA IN DIFFERENTIAL MODE

TECHNICAL FIELD OF THE INVENTION

The present invention relates to the coupling of an electronic circuit to at least one antenna unit in order to exchange electric signals between the electronic circuit and the at least one antenna unit, and in particular to a coupling device for coupling an electronic circuit to at least one antenna unit by means of fully differential signal paths.

In RF (radio frequency) applications an efficient coupling of antenna units to electronic circuits in order to transmit RF signals provided by the electronic circuits or to receive RF signals detected by antenna units is essential. A conventional coupling device arranged between an electronic circuit and an antenna unit comprises, e.g. amplifier units, matching units and filter units. The respective units comprise single ended and/or differential inputs and outputs. Conventionally a power amplifier has to be coupled to an antenna unit having a single ended input.

In case the amplifier unit has a differential output a balun is required in order to convert a differential signal path to a single ended signal path and in order to provide an impedance matching transformation.

In conventional arrangements a signal provided by an electronic circuit is amplified by an amplifier unit and passes through following stages, i.e. a matching unit and a filter unit and is provided as a single ended signal at the output of a conventional coupling device. Finally the signal output from the conventional coupling device will drive a single ended antenna unit. A disadvantage of such arrangements is that a balun required to convert the signal path from differential to single ended may deteriorate a signal performance and may increase component costs.

A balun is a device that connects a balanced line, i.e. a line that has two conductors with equal currents in opposite directions, such as a twisted pair cable, to an unbalanced line, i.e. one line has just one conductor and a ground, such as a coaxial cable. Thus, a balun is a type of transformer which is used to convert an unbalanced signal to a balanced one or vice versa. Baluns isolate a transmission line and provide a balanced output, whereby one pair of terminals is balanced, that is the currents are equal in magnitude and opposite in phase, whereas the other pair of terminal is unbalanced, whereby one side is connected to electrical ground and the other side carries a signal to be transferred. Furthermore, an impedance transformation is provided in addition to a conversion between balanced and unbalanced signal modes.

FIG. 2, FIG. 3 and FIG. 4 show conventional arrangements of coupling devices for coupling an electronic circuit to at least one antenna. As shown in FIG. 2(a) a power amplifier PA has single ended inputs and outputs and is coupled to a matching network in a single ended way. The output of the matching network is fed a filter where the impedance matched signal is filtered. The output of the filter is connected to an antenna. As mentioned above, one side is electrically connected to ground.

FIG. 2(b) shows details of the block diagram of FIG. 2(a). A signal source 115 provides a single ended electrical signal coupled to a single ended input/output amplifier 201 via a capacitor C1. The single ended input/output amplifier 201 consists of a transistor T2, a collector inductance L1 and bias resistors R1, R2. A single ended input/output network 202 is coupled to the output of the single ended input/output amplifier 201. The single ended input/output network 202 essentially comprises a T-type filter unit consisting of two serially coupled inductances L2, L3 and a capacitor C2, connected between the connection point of the two inductances L2, L3 and ground 117. A single ended antenna unit A is coupled to the output of the single ended input/output network for radiating RF energy.

Another conventional arrangement of a coupling device is shown in a block diagram of FIG. 3(a). The arrangement of FIG. 3(a) comprises a differential power amplifier 203 having a differential input and a single ended output. The remaining coupling device, i.e. a matching network and a filter are designed as single ended input/output units as in the conventional arrangement of FIG. 2(a).

FIG. 3(b) shows the arrangement of FIG. 3(a) in more detail. The single ended input/output network 202 corresponds to the single ended input/output network 202 shown in FIG. 2 and thus a description thereof is omitted. The differential input into the differential input/single ended output amplifier 203 is converted into a single ended output coupled to the antenna A.

The differential input/single ended output amplifier essentially consists of two transistors T3a, T3b and two respective collector resistors R3a, R3b. A signal from a signal source 115 is fed differentially to the inputs (bases) of the transistors T3a, T3b of the differential input/single ended output amplifier 203. The emitters of the transistors T3a, T3b are connected to each other and to one terminal of a current source 116. The other terminal of the current source 116 is connected to ground 117. In the arrangement shown in FIG. 3(b) the amplified signal is output at the connection point between the collector resistor R3b and the transistor T3b. Consequently the single ended output signal is fed to the single ended input/output network 202, as already described with reference to FIG. 2(b).

It is noted that the conventional coupling devices according to FIGS. 2 and 3 comprise single ended signal paths from the output of a power amplifier through an antenna A.

It has been proposed to employ differential input/output amplifiers having both a differential input and a differential output as power amplifiers in order to amplify signals provided for a subsequent matching network. Such an arrangement is shown in FIG. 4(a) wherein a differential input/output amplifier 122 receives differential input signals and provides amplified differential output signals. The conventional arrangement comprises single ended input/output units as a matching network and a filter in order to feed a single ended antenna. Thus, the pair of input terminals into the matching network is unbalanced whereas the output of the differential input/output amplifier 122 is balanced. The matching network and the filter shown in FIG. 4(a) comprise electric connections wherein one side is connected to electrical ground 115 and the other side carries the signal to be transferred.

In this case, as already mentioned above, it is necessary to convert the signal path from differential to single ended. Such a conversion is provided by means of a balun unit 204 that connects the balanced output line of the differential input/output amplifier 122 to the unbalanced input line of the subsequent matching network.

Thus, it is a disadvantage of the conventional arrangement shown in FIG. 4(a) that it is necessary to provide an additional unit between the differential input/output amplifier 122 and a subsequent matching and filter network. The differential input/output amplifier 122 is similar to the differential input/single ended output amplifier 203 shown in FIG. 3(*b*) except that a differential output is provided wherein two output lines are connected to the connection points between the transistor T3*a* and the collector resistor R3*a* and the transistor T3*b* and the collector resistor R3*b*, respectively.

Thus, a differential output signal path is provided which is connected to the primary side P of the balun unit 204. The secondary side S of the balun unit 204 is connected between the single ended signal path of the single ended input/output network 202 and ground 117. The single ended input/output network 202 corresponds to the single ended input/output networks 202 shown in FIGS. 2(*b*) and 3(*b*) and thus a description thereof is omitted here. The output of the single ended input/output network 202 is coupled to the antenna A via a single ended signal path.

It is a major disadvantage of conventional arrangements using differential input/output amplifiers having differential input lines and differential output lines, and single ended input/output networks following a differential input/output amplifier that a balun unit is required in order to adapt a balanced line to an unbalanced line. Disadvantageously a balun unit results in an increasing complexity of the entire electronic arrangement and in signal losses caused by the balun unit. Furthermore, it is a disadvantage of conventional arrangements that an additional component, e.g. the balun unit, has to be provided which increases overall costs.

Another major disadvantage of conventional arrangements using single ended input/output networks connected between a differential amplifier unit and a single ended antenna unit is that currents are injected into a ground plane thus that the injected currents depend on changes in ground equivalence impedance distribution. This situation may cause differences in voltage levels that deteriorate a signal performance in terms of noise injection.

SUMMARY OF THE INVENTION

It is thus an object of the present invention to provide a coupling device for an efficient coupling of an electronic circuit to at least one antenna unit without the requirement of additional balun units.

This object is achieved by a coupling device for coupling an electronic circuit to at least one antenna unit having the features of claim 1. Furthermore, the object is achieved by a method for coupling an electronic circuit to at least one antenna unit comprising the steps of claim 13. Further advantageous embodiments are according to the dependent claims.

The core idea of the invention is to avoid additional units for converting differential signal paths to single ended signal paths or vice versa by providing fully differential signal paths between the electronic circuit generating electrical signals to be sent via an antenna or detecting electrical signals received by an antenna, and the antenna.

It is thus an advantage of the present invention that a differential signal, propagating between the electronic circuit and the antenna, is not influenced by adverse effects of a ground plane which has to be provided in the case of unbalanced lines. Another advantage of not having the balun in accordance with the invention is also that the amplifier gain can be reduced.

Using completely differential signal paths the return path is not in a ground plane but a signal line. It is advantageous that differences in voltage levels from point to point that deteriorate the signal performance in terms of noise injection are not created. Furthermore, it is an advantage that transmission signal paths from the electronic circuit to the antenna and receiving signal paths from the antenna to the electronic circuit exhibit the same configuration such that the ground plane has no adverse influences. Thus, noise effects can be avoided. Furthermore, losses at the output of a power amplifier can be avoided. Moreover a better signal-to-noise ratio compared to conventional arrangements can be provided. The coupling device for coupling an electronic circuit for at least one antenna unit to exchange signals between the electronic circuit and the at least one antenna unit essentially comprises:

a) first input/output terminals connected to the electronic circuit by means of a first input/output signal path;

b) a matching unit coupled to the first input/output terminals by means of a first signal path for performing an impedance matching with respect to the electrical signals;

c) a filter unit coupled to the output of the matching unit by means of a second signal path for filtering the electrical signals; and d) second input/output terminals connected to the filter unit and the at least one antenna unit by means of a second input/output signal path, wherein the signal paths arranged between the electronic circuit and the at least antenna unit are provided completely differential.

According to an aspect of the present invention the coupling device further comprises an amplifier unit for amplifying input signals fed to the first input/output terminals. It is advantageous that the amplifier unit may include a differential amplifier.

According to another aspect of the present invention the matching unit includes a differential arranged matching network.

According to yet another aspect of the present invention the filter unit includes a differentially arranged filter network.

According to yet another aspect of the present invention the at least one antenna unit is a differential antenna coupled to the filter unit. Preferably, the differential antenna is a dipole antenna.

According to yet another aspect of the present invention the signal paths are provided as twisted pair lines.

According to yet another aspect of the present invention the signal paths are provided as bi-directional signal paths for exchanging electrical signals between the electronic circuit and the at least one antenna unit.

According to yet another aspect of the present invention the signal paths are provided as uni-directional signal paths for transferring electrical signals from the electronic circuit to the at least one antenna unit or vice versa.

According to yet another aspect of the present invention the signal paths are provided as signal paths being isolated from a ground plane for exchanging electrical signals between the electronic circuit and the at least one antenna unit.

A method for coupling an electronic circuit for at least one antenna unit to exchange electrical signals between the electronic circuit and the at least one antenna unit essentially comprises the following steps:

a) inputting electrical signals into first input/output terminals connected to the electronic circuit by means of a first input/output signal path;

b) performing an impedance matching with respect to the inputted electrical signals by means of a matching unit coupled to the first input/output terminals via a first signal path;

c) filtering the electrical signals by means of a filter unit coupled to the output of the matching unit via a second signal path; and d) outputting the filtered electrical signals by means of second input/output terminals connected to the filter unit and to the at least one antenna unit via a second input/output signal path, wherein the electrical signals are transferred completely differentially between the electronic circuit and the at least one antenna unit by means of differentially arranged signal paths.

According to yet another aspect of the present invention input signals fed to the first input/output terminals are differentially amplified by an amplifier unit.

According to yet another aspect of the present invention the electrical signals are exchanged bi-directionally between the electronic circuit and the at least one antenna unit via the signal paths.

According to yet another aspect of the present invention the electrical signals are transferred uni-directionally from the electronic circuit to the at least one antenna unit via signal paths or vice versa.

According to yet another aspect of the present invention the signal paths are isolated from a ground plane for exchanging electrical signals between the at least one antenna unit and the electronic circuit.

BRIEF DESCRIPTION OF THE DRAWINGS

Embodiments of the present invention are depicted in the drawings and are explained in more detail in the following description.

In the drawings.

Same reference numerals refer to same or similar elements or steps in the drawings.

DETAILED DESCRIPTION OF PREFERRED EMBODIMENTS

The present invention now will be described more fully hereinafter with reference to the accompanying drawings, in which preferred embodiments of the invention are shown.

Figure 1:
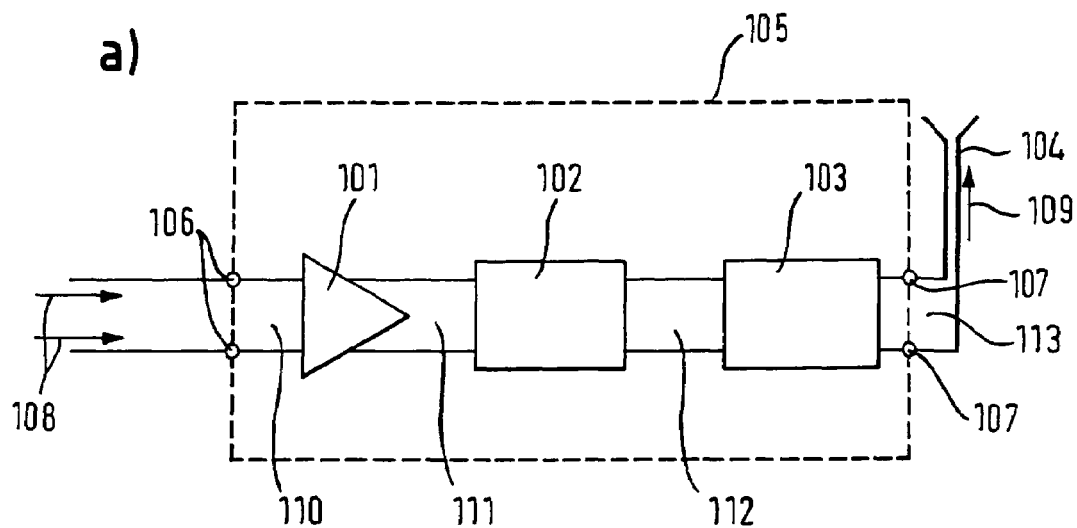
FIG. 1(a) illustrates a block diagram of a coupling device according to a preferred embodiment of the present invention.
FIG. 1(b) exhibits circuit details of the arrangement shown in FIG. 1(a)
Figure 1:
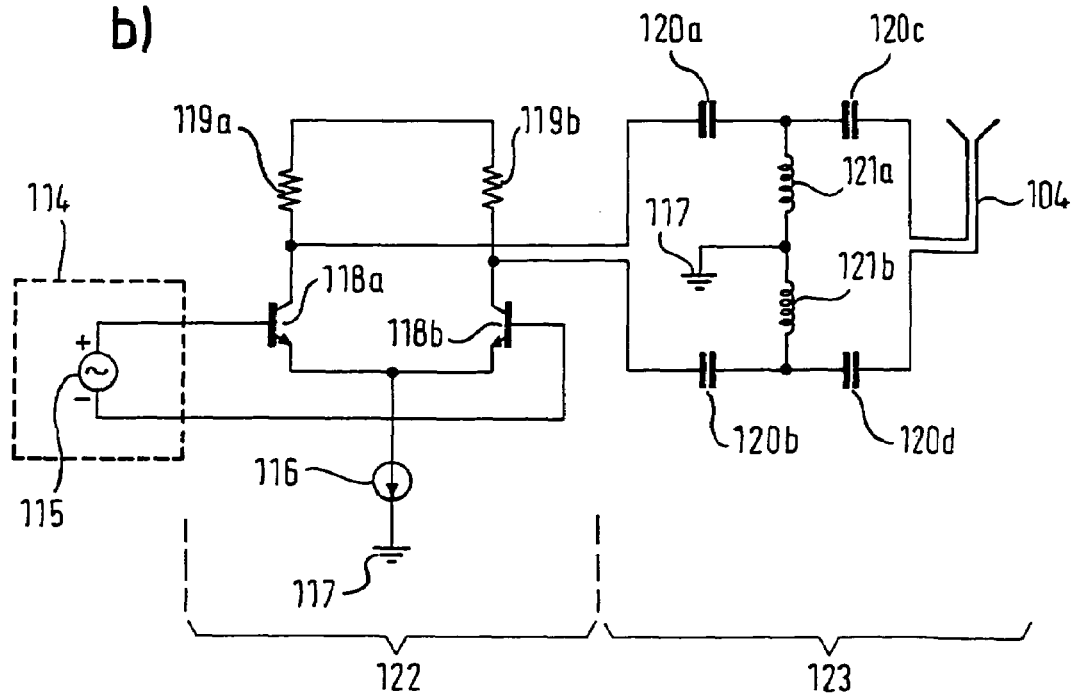
Figure 2:
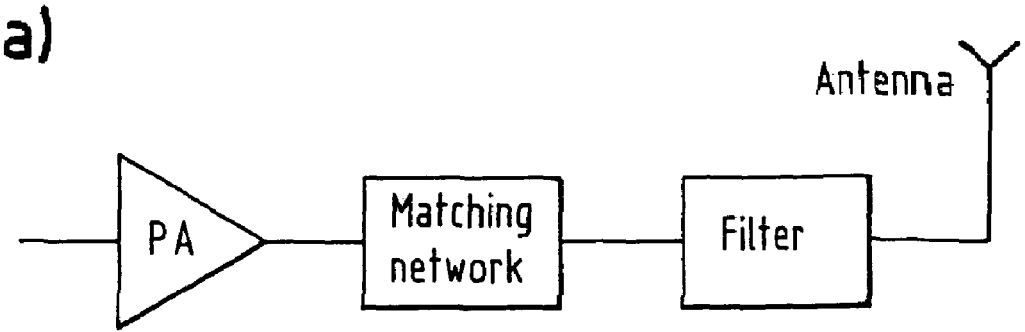
FIG. 2(a) shows a conventional coupling device employing a single ended input/output amplifier.
FIG. 2(b) exhibits circuit details of the circuit arrangement shown in FIG. 2(a)
Figure 2:
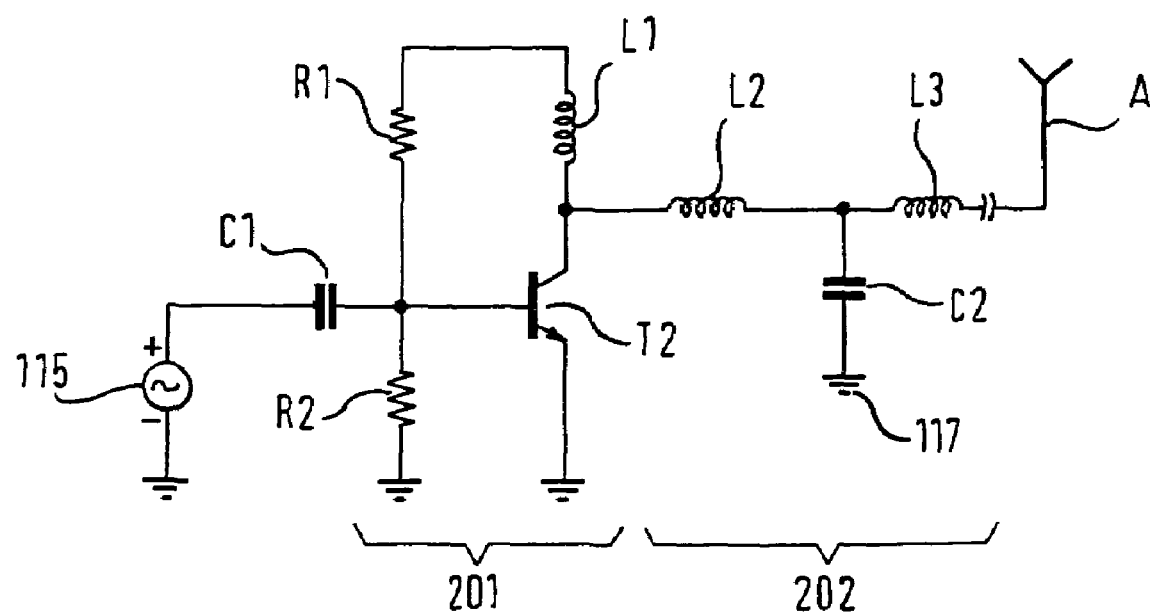
Figure 3:
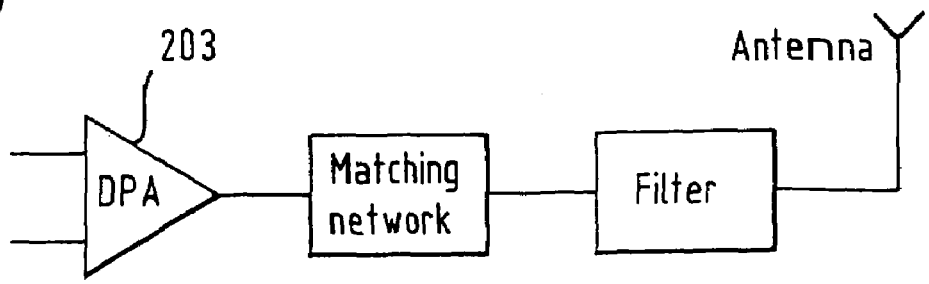
FIG. 3(a) shows a conventional coupling device employing a differential input/single ended output amplifier.
FIG. 3(b) shows details of the conventional arrangement illustrated in FIG. 3(a)
Figure 3:
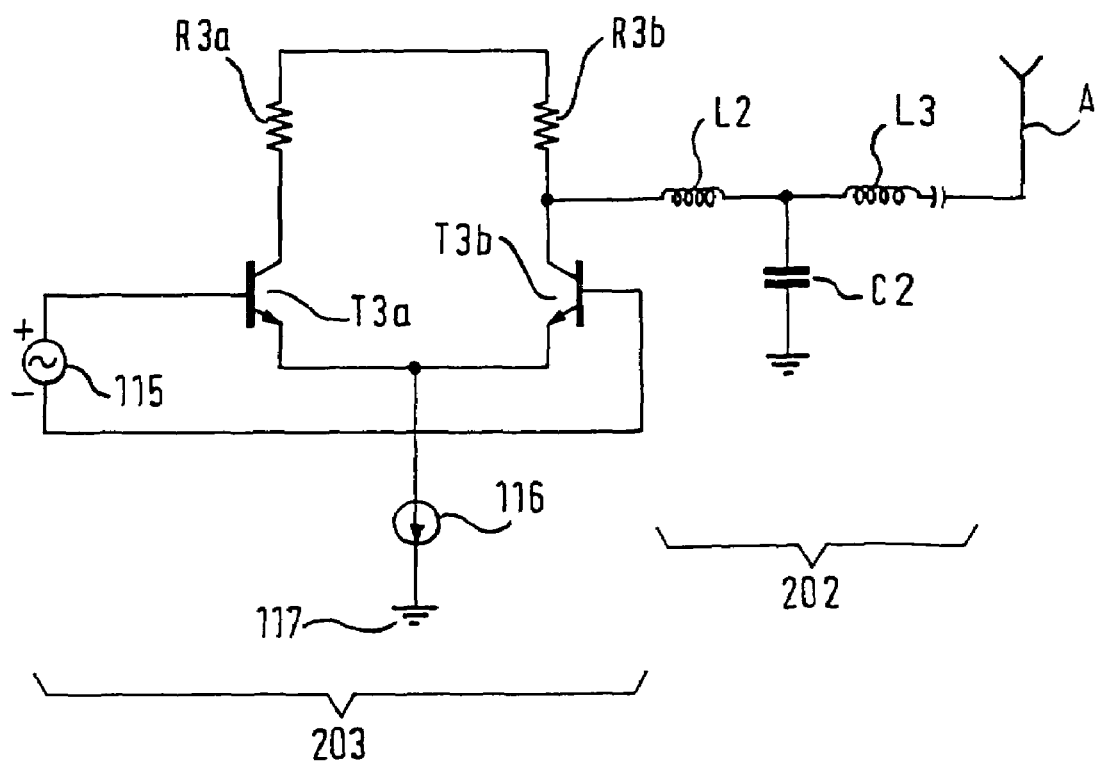

FIG. 1(a) is a block diagram of a coupling device 105 according to a preferred embodiment of the present invention. The coupling device is designed to couple at least one antenna unit 104 to an electronic circuit 114 (shown in FIG. 1(b) and described below). It is noted that one or more antenna units 104 can be coupled to the coupling device 105 as is appropriate for a given application.

Furthermore, it is noted that the signal paths can be provided uni-directional from the electronic circuit 114 to the antenna unit 104 as it is shown in the preferred embodiment described with reference to FIG. 1(a) and FIG. 1(b), or the signal paths can be provided uni-directional from the antenna unit 104 to the electronic circuit 114. Furthermore, the signal paths can be provided bi-directional to exchange electrical signals between the electronic circuit 114 and the antenna unit 104.

The electronic circuit 114 provides a differential input signal 108 which is fed to first input/output terminals 106 of the coupling device 105. It is preferred that a differential amplifier unit 101 is provided for amplifying the differential input signal 108.

The amplifier unit 101 is formed as a differential input/output amplifier 122 as shown below with reference to FIG. 1(b). Thus, a differentially amplified electric signal is output from the amplifier unit 101. Via a first signal path which is ranged differentially the differential output signal from the amplifier unit 101 is transferred to a matching unit 102 which is provided as a differential matching unit as a part of a matching/filter network 123 illustrated in FIG. 1(b) below. According to the present invention the matching/filter network 123 is provided fully differential. Thus, a second signal path 112 connecting the matching unit and a filter unit which is a second part of the matching/filter network shown in FIG. 1(b) is provided fully differential. The filter unit 103 is provided fully differential, too, thus that a differential output signal of the filter unit 103 is fed to second input/output terminals 107.

Thus, the coupling device 105 has a first input/output signal path 110 which is fully differential and a second input/output signal path 113 which is differential, too.

A differential output signal 109 which is provided by the coupling device 105 is fed to the antenna unit 104. Preferably the antenna unit is a differential antenna, and more preferably the antenna unit is a dipole antenna.

According to the present invention the signal paths 110, 111, 112 and 113 arranged between the electronic circuit 114 and the at least one antenna unit 104 are provided completely differential. Preferably the matching unit 102 includes a differentially arranged matching network which will be described with reference to FIG. 1(b).

More preferably the filter unit 103 includes a differentially arranged filter network which will be described with reference to FIG. 1(b). Furthermore, it is an advantage that the signal paths 110, 111, 112 and 113 are completely isolated from the ground plane 117 thus that noise influence caused by a ground plane is eliminated.

FIG. 1(b) shows circuit details of the block diagram of the coupling device 105 according to a preferred embodiment of the present invention.

A reference numeral 114 designates an electronic circuit which is capable of providing electrical signals to be sent via the antenna unit 104 and/or to receive electrical signals detected by the antenna unit 104. In order to simplify the explanation a signal source 115 is shown to provide electrical signals for the differential in input/output amplifier 122. The differential input/output amplifier 122 essentially consists of two transistors 118a, 118b, the basis of which are differentially connected to the output of the signal source 115. The emitters of the transistors 118a, 118b are connected to each other and to one terminal of a current source 116, the other terminal of which is connected to ground 117 (ground plane).

The collectors of the transistors 118a, 118b are respectively connected to resistive elements 119a, 119b function ing as collector resistors. The other terminals of the resistive elements 119a, 119b are connected to each other. A differential signal path is provided by connecting a differential line as an output line of the differential input/output amplifier 122. One part of the differential output line is connected to the connection point between the collector of the transistor 118a and the resistive element 119a, whereas the other part of the differential output line is connected to the connection point between the collector of the transistor 118b and the resistive element 119b. Thus, a differential output path of the differential input/output amplifier 122 is created.

According to third embodiment of the present invention a matching/filter network 123 is designed such that a fully differential connection between the differential antenna unit 104 and the differential output line of the differential input/output amplifier 122 can be provided. The matching/filter network 123 consists of two capacitive elements 120a, 120c and 120b, 120d, respectively in each signal line connected to the differential input/output amplifier 122. The capacitive elements 120a and 120c are connected in series whereas the connection point between the capacitive elements 120a, 120b is connected to one terminal of an inductive element 121a. The other terminal of the inductive element 121a is connected to ground 117. In a symmetrical way the connection point in the capacitive elements 120c and 120d which are connected in series is connected to one terminal of a second inductive element 121b. The other terminal of the inductive element 121b is connected to ground 117. The capacitive elements 120a, 120b, 120c and 120d and the inductive elements 121a and 121b are designed such that an appropriate impedance matching and/or an appropriate filtering is provided by the matching/filter network. As shown in FIG. 1(b), right part, the output of the matching/filter network 123 is a fully differential line connected to the differential antenna unit 104.

Figure 4:
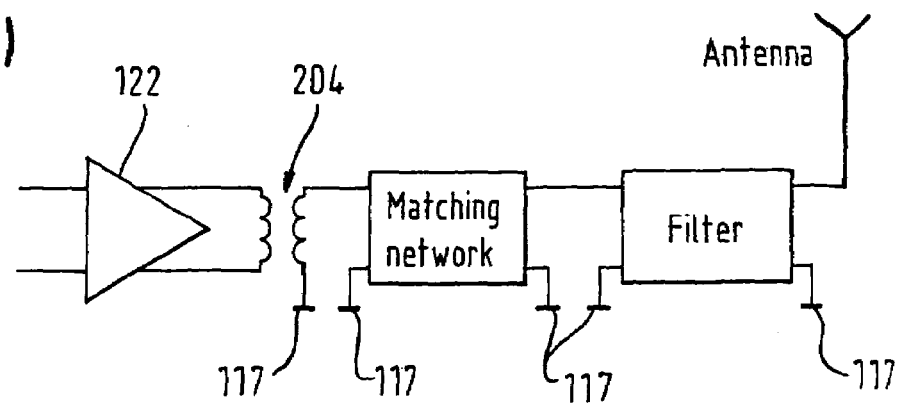
FIG. 4(a) shows a conventional coupling device employing a differential input/output amplifier.
FIG. 4(b) shows details of the conventional arrangement shown in FIG. 4(a).
Figure 4:
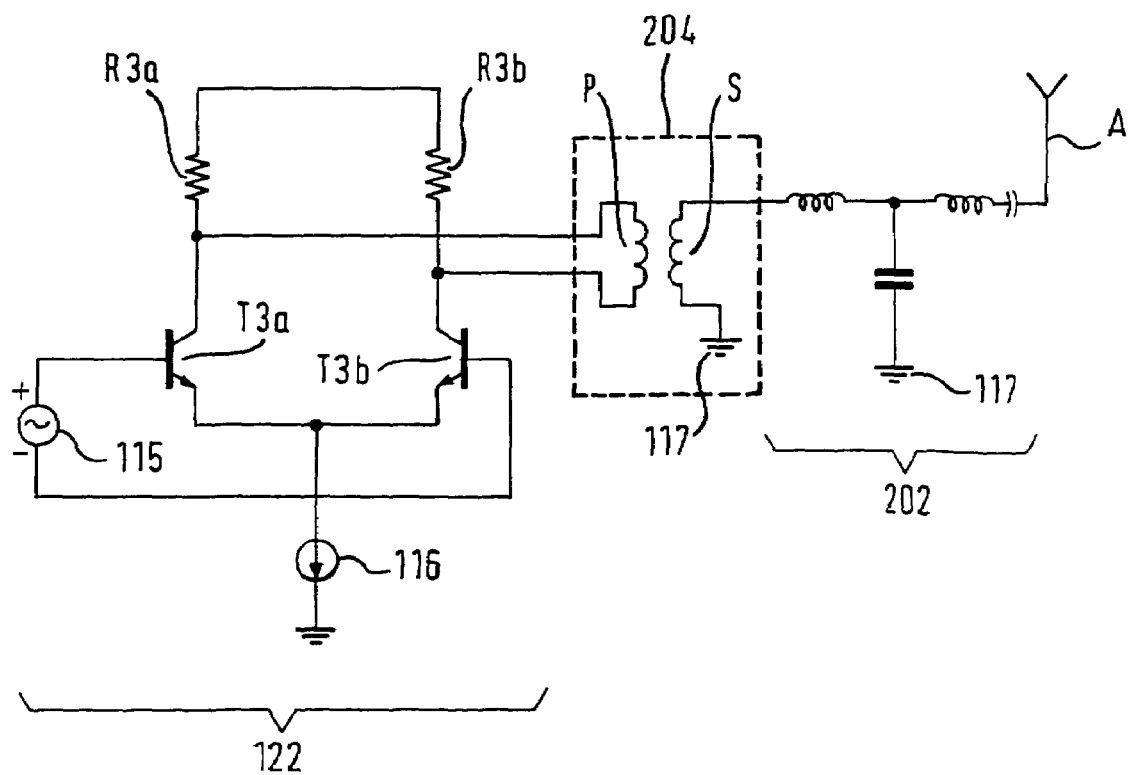

Compared to a conventional arrangement shown in FIG. 4(a) and in FIG. 4(b) a balun unit can be eliminated in the preferred embodiment because the signal paths 110, 111, 112 and 113 arranged between the electronic circuit 114 and the at least antenna unit 104 are provided completely differential.

While preferred embodiments have been shown and described, various modifications and substitutions may be made thereto without departing from the spirit and scope of the invention. Accordingly it is to be understood that the present invention has been described by way of illustration and not limitation.

Furthermore, the invention is not limited to the specific application areas mentioned above.

The entire disclosure of European Serial No. 03 020 433.3 filed Sep. 11, 2003 is incorporated by reference.

What is claimed is:

1. A coupling device for coupling an electronic circuit to at least one antenna unit to exchange electrical signals between the electronic circuit and the at least one antenna unit, comprising:
    a) first input/output terminals connected to the electronic circuit by a first input/output signal path;
    b) a matching unit coupled to the first input/output terminals by a first signal path for performing an impedance matching with respect to the electrical signals;
    c) a filter unit coupled to the output of the matching unit by a second signal path for filtering the electrical signals; and
    d) second input/output terminals connected to the filter unit and the at least one antenna unit by a second input/output signal path, wherein e) the signal paths arranged between the electronic circuit and the at least one antenna unit are provided completely differential, and
    f) the matching unit includes a differentially arranged matching network.

2. The device according to claim 1, further comprising an amplifier unit for amplifying input signals fed to the first input/output terminals.

3. The device according to claim 2, wherein the amplifier unit includes a differential amplifier.

4. The device according to claim 1, wherein the filter unit includes a differentially arranged filter network.

5. The device according to claim 1, wherein the at least one antenna unit comprises a differential antenna coupled to the filter unit.

6. The device according to claim 5, wherein the differential antenna comprises a dipole antenna.

7. The device according to claim 1, wherein the signal paths are formed of twisted pair lines.

8. The device according to claim 1, wherein the signal paths are provided as bi-directional signal paths for exchanging electrical signals between the electronic circuit and the at least one antenna unit.

9. The device according to claim 1, wherein the signal paths are provided as unidirectional signal paths for transferring electrical signals from the electronic circuit to the at least one antenna unit.

10. The device according to claim 1, wherein the signal paths are provided as signal paths isolated from a ground plane for exchanging electrical signals between the at least one antenna unit and the electronic circuit.

11. A method for coupling an electronic circuit to at least one antenna unit to exchange electrical signals between the electronic circuit and the at least one antenna unit, comprising the following steps:
    a) inputting electrical signals into first input/output terminals connected to the electronic circuit by a first input/output signal path;
    b) performing impedance matching with respect to the inputted electrical signals by a matching unit coupled to the first input/output terminals via a first signal path;
    c) filtering the electrical signals by a filter unit coupled to the output of the matching unit via a second signal path; and
    d) outputting the filtered electrical signals by second input/output terminals connected to the filter unit and to the at least one antenna unit via a second input/output signal path, wherein e) the electrical signals are transferred completely differentially between the electronic circuit and the at least one antenna unit by differentially arranged signal paths, and
    f) the matching unit includes a differentially arranged matching network.

12. The method according to claim 11, wherein input signals fed to the first input/output terminals are differentially amplified by an amplifier unit.

13. The method according to claim 11, wherein the signal paths are provided as twisted pair lines.

14. The method according to claim 11, wherein the electrical signals are exchanged bi-directionally between the electronic circuit and the at least one antenna unit via the signal paths.

15. The method according to claim 11, wherein the electrical signals are transferred uni-directionally from the electronic circuit to the at least one antenna unit via the signal paths.

16. The method according to claim 11, wherein the signal paths are isolated from a ground plane for exchanging electrical signals between the at least one antenna unit and the electronic circuit.

\* \* \* \* \*